(12) United States Patent
Matsunaga et al.

(10) Patent No.: US 6,556,406 B1
(45) Date of Patent: Apr. 29, 2003

(54) SOLID-STATE RELAY

(75) Inventors: Nobutomo Matsunaga, Kyoto (JP);
Hiroshi Hashimoto, Kyoto (JP); Yasuo Hayashi, Kyoto (JP)

(73) Assignee: Omron Corporation, Kyoto (JP)

( * ) Notice: Subject to any disclaimer, the term of this patent is extended or adjusted under 35 U.S.C. 154(b) by 0 days.

(21) Appl. No.: 09/622,099
(22) PCT Filed: Feb. 10, 1999
(86) PCT No.: PCT/JP99/00564
§ 371 (c)(1),
(2), (4) Date: May 7, 2001
(87) PCT Pub. No.: WO99/41835
PCT Pub. Date: Aug. 19, 1999

(30) Foreign Application Priority Data

Feb. 12, 1998 (JP) ............................... 10-046300

(51) Int. Cl.⁷ ................................ H02H 3/00
(52) U.S. Cl. ............................ 361/100; 361/18; 361/58; 361/118
(58) Field of Search ........................... 361/18, 118, 117, 361/58, 93.1, 91.1, 113

(56) References Cited

U.S. PATENT DOCUMENTS 5,146,386 A * 9/1992 Learned ...................... 361/91.4
5,440,440 A * 8/1995 Du ............................... 361/18

FOREIGN PATENT DOCUMENTS

| JP | 58-191626 | 12/1983 | ............ H01G/9/00 |
| JP | 60-79837 | 6/1985 | ............ H03K/17/16 |
| JP | 2-49227 | 4/1990 | ............ H03K/17/04 |
| JP | 7-226130 | 8/1995 | ............ H01H/33/00 |
| JP | 8-32020 | 2/1996 | ............ H01L/25/07 |

OTHER PUBLICATIONS

Earth and Bypass Capacitor, 1979.

* cited by examiner

*Primary Examiner*—Stephen W. Jackson
(74) *Attorney, Agent, or Firm*—Morrison & Foerster LLP

(57) ABSTRACT

A solid state relay has a first external connection terminal which is conductive with one end of a main switching element, and a second external connection terminal which is conductive with another end of the main switching element, and is used with a load and a power source connected in series between the external connection terminals. A third external connection terminal is disposed in the solid state relay. The third external connection terminal is connected to the second external connection terminal via a capacitor. The load and the power source are connected in series between the first external connection terminal and the second external connection terminal, and a node of the load and the power source is connected to the third external connection terminal, thereby allowing the resistance of the load and the electrostatic capacitance of the capacitor to constitute an RC filter circuit for preventing noise leakage. Therefore, a solid state relay is obtained in which less EMI noise (noise terminal voltage) is generated, and which can be produced without especially increasing the cost and the size as compared with a relay of the conventional art.

5 Claims, 12 Drawing Sheets

SOLID-STATE RELAY

TECHNICAL FIELD

The present invention relates to a solid state relay, and more particularly to a novel solid state relay in which less EMI noise leaks in to a power source, and which can be produced without especially increasing the cost and the size as compared with a relay of the conventional art.

BACKGROUND ART

Usually, a solid state relay is configured so that an input circuit and an output circuit are electrically insulated from each other by a photocoupler, and a main switching element (thyristor, triac (triode bilateral thyristor), or the like) interposed in the output circuit is operated in accordance with an electric signal applied to the input circuit, thereby closing or opening a load connected to the output circuit.

As a solid state relay of the conventional art, for example, known are a first conventional art example shown in FIG. 8, a second conventional art example shown in FIG. 9, and a third conventional art example shown in FIG. 10. In the solid state relay of the first conventional art example, a trigger system is employed in which the main switching element is triggered by a triac coupler. In the solid state relay of the second conventional art example, a trigger system is employed in which the main switching element is triggered by a diode bridge and a thyristor. In the solid state relay of the third conventional art example, a trigger system is employed in which the main switching element is triggered by a diode bridge and a thyristor coupler. These three trigger systems can be realized at a low cost, and hence are used in many solid state relays.

FIG. 11A shows a connection example in the case where the solid state relays shown in FIGS. 8, 9, and 10 are used. In the figure, 1109 denotes a solid state relay (SSR), 1107 and 1108 denote input terminals of the solid state relay, 1104 and 1103 denote load terminals of the solid state relay (and serving also as a pair of external connection terminals which are conductive with the ends of the incorporated main switching element), 1111 denotes an input signal voltage in this case it is a symbol for a DC power source, 1122 denotes a load which is to be driven, and 1123 denotes an AC power source for driving an external load.

The details of the solid state relays shown in FIGS. 8, 9, and 10 will be sequentially described.

In the first conventional art example shown in FIG. 8, a triac (triode bilateral thyristor) 816 serving as a main switching element is triggered by a photo-triac(triode bilateral thyristor) coupler 813. In the figure, 807 and 808 denote a pair of input terminals to which the input signal voltage 1111 (see FIG. 11A) is supplied, 812 denotes an input circuit which functions as a buffer or the like for an input signal, 813 denotes the photo-triac coupler (configured by optically coupling a light emitting diode 814 with a photo-triac 815) which electrically insulates the input circuit 812 and an output circuit from each other, 816 denotes a power triac incorporated into the output circuit and serving as a main switching element, 817 denotes a current limiting resistor for the photo-triac 815, 818 denotes a gate bias resistor for the power triac 816, a resistor element 819 and a capacitor element 820 are connected in series to constitute a surge absorbing circuit, and 804 and 803 denote a pair of external connection terminals which are conductive with the ends of the triac serving as the main switching element.

The operation in the case where the solid state relay of the first conventional art example is employed as the solid state relay (SSR) 1109 shown in the connection diagram of FIG. 11A will be described with reference to FIGS. 11B and 11C.

The relationship between the load current I and the voltage $V_T$ between the terminals 803 and 804 during the operation of the solid state relay are indicated by the broken and solid lines in the waveform chart of FIG. 11B. In this case, a resistance load is as the load 1122. In the figure, when the terminal-to-terminal voltage $V_T$ reaches a specified on-start voltage $V_{ON}$ in accordance with the voltage of the power source 1123 as indicated by the sold line in the figure the power triac 816 serving as the main switching element is turned on, thereby causing the load current I to start flowing through the load 1122. At the same time, the terminal-to-terminal voltage $V_T$ instantly drops to a specified power-chip ON voltage (ON-state voltage) $V_{TM}^P$.

The change of the terminal-to-terminal voltage (voltage between the terminals 803 and 804) $V_T$ before and after turning on the power triac 816 is enlarged and shown in FIG. 11C. As shown in the figure, the on-start voltage $V_{ON}$ that is equal to the terminal-to-terminal voltage $V_T$ at which the triac 816 is triggered (hereinafter, indicated as $V_{ON1}$ in the first conventional art example) is determined by the sum of the voltage drop ($I_G \times R_{GS}$) of the current limiting resistor 817 due to the operation current $I_G$ of the photo-triac 815, the on-state voltage $V_{TM1}$ of the photo-triac 815, and the voltage drop $V_{GT}$ of the resistor 818 as indicated by following expression (Eq. 1):

$$V_{ON1} = I_G \times R_{GS} + V_{TM1} + V_{GT}. \quad (\text{Eq. 1})$$

As apparent from this, in the trigger circuit of the first conventional art example, the on-state voltage $V_{TM1}$ of the photo-triac 815 which serves as a triggering element is high, and hence the on-start voltage $V_{ON1}$ at which the triac 816 which serves as the main switching element is triggered is inevitably made higher. This causes a problem in that the noise terminal voltage is high.

Next, in the second conventional art example shown in FIG. 9, a triac(triode bilateral thyristor) 916 serving as a main switching element is triggered by using a diode bridge 917 and a thyristor 922. In the figure, 907 and 908 denote a pair of input terminals to which the input signal voltage 1111 (see FIG. 11A) is supplied, 912 denotes an input circuit which functions as a buffer or the like for an input signal, 913 denotes a phototransistor coupler (configured by optically coupling a light emitting diode 914 with a phototransistor 915) which electrically insulates the input circuit 912 and a trigger circuit 921 in an output circuit from each other, 916 denotes a power triac incorporated into the output circuit and serving as a main switching element, 917 denotes the diode bridge which rectifies the power source voltage and then applies the rectified voltage to a thyristor 922, 922 denotes the thyristor which is triggered by the trigger circuit 921 to trigger the main switching element, 918 denotes a gate bias resistor for the power triac 916, a resistor element 919 and a capacitor element 920 are connected in series to constitute a surge absorbing circuit, and 904 and 903 denote a pair of external connection terminals which are used to lead out the ends of the triac which serve as the main switching element to the outside.

Also the operation in the case where the solid state relay of the second conventional art example is employed as the solid state relay (SSR) 1109 shown in the circuit diagram of FIG. 11A which will be described with reference to FIGS. 11B and 11C in the same manner as the first embodiment. Also in the second embodiment, the on-start voltage $V_{ON}$ that is equal to the terminal-to-terminal voltage $V_T$ at which the triac 916 is triggered in the same manner as the first conventional art example (hereinafter, indicated as $V_{ON2}$ in the second conventional art example) is determined by the sum of the on-state voltage $V_{TM2}$ of the thyristor 922, the on-state voltage ($2 \times V_F$) of diodes in the diode bridge 917, and the voltage drop $V_{GT}$ of the resistor 918 as indicated by following expression (Eq. 2):

$$V_{ON2} = V_{TM2} + 2 \times V_F + V_{GT}. \quad \text{(Eq. 2)}$$

As apparent from this, in the trigger circuit of the second conventional art example, the on-state voltages $V_{TM2}$ and $V_F$ of the elements (the thyristor 922 and the diode bridge 917) are high, and hence also the on-start voltage $V_{ON2}$ to trigger the triac 916 which serves as the main switching element is inevitably made higher. This causes a problem in that the noise terminal voltage is high.

Next, in the third conventional art example shown in FIG. 10, a triac(triode bilateral thyristor) 1016 serving as a main switching element is triggered by using a diode bridge 1017 and a photo-thyristor coupler 1013. In the figure, 1007 and 1008 denote a pair of input terminals to which the input signal voltage 1111 (see FIG. 11A) is supplied, 1012 denotes an input circuit which functions as a buffer or the like for an input signal, 1013 denotes the photo-thyristor coupler (configured by optically coupling a light emitting diode 1014 with a photo-thyristor 1015) which electrically insulates the input circuit 1012 and an output circuit from each other, 1016 denotes a power triac that is incorporated into the output circuit and serves as a main switching element, 1017 denotes the diode bridge which rectifies the power source voltage and then applies the rectified voltage to the photo-thyristor 1015, a circuit configured by a resistor 1021 and a capacitor 1022 is a firing angle control circuit for the photo-thyristor, 1018 denotes a gate bias resistor for the power triac 1016, a resistor element 1019 and a capacitor element 1020 are connected in series to constitute a surge absorbing circuit, and 1004 and 1003 denote a pair of external connection terminals which are used to lead out the ends of the triac which serves as the main switching element to the outside.

Also, the operation in the case where the solid state relay of the third conventional art example is employed as the solid state relay (SSR) 1109 as shown in the circuit diagram of FIG. 11A will be described with reference to FIGS. 11B and 11C in the same manner as the first embodiment. Also in the third embodiment, the on-start voltage $V_{ON}$ that is equal to the terminal-to-terminal voltage $V_T$ at which the triac 1016 is triggered in the same manner as the first conventional art example (hereinafter, indicated as $V_{ON3}$ in the third conventional art example) is determined by the sum of the on-state voltage $V_{TM3}$ of the photo-thyristor 1015, the on-state voltage ($2 \times V_F$) of diodes in the diode bridge 1017, and the voltage drop $V_{GT}$ of the resistor 1018 as indicated by following expression (Eq. 3):

$$V_{ON3} = V_{TM3} + 2 \times V_F + V_{GT}. \quad \text{(Eq. 3)}$$

As apparent from this, in the trigger circuit of the third conventional art example, the on-state voltages $V_{TM3}$ and $V_F$ of the elements (the photo-thyristor 1015 and the diode 1017) are high, and hence the on-start voltage $V_{ON3}$ to trigger the triac 1016 serving as the main switching element is triggered is inevitably made higher. This causes a problem in that the noise terminal voltage is high.

Although the above three examples in which a main switching element is a triac(triode bilateral thyristor) have been described, the problem of a high noise terminal voltage (EMI noise) similarly occurs also in the case where a main switching element is a thyristor.

As apparent from the waveform chart shown in FIG. 11C, it will be seen that the noise terminal voltage can be reduced by making the on-start voltage $V_{ON}$ to trigger the triac(triode bilateral thyristor) serving a main switching element and the power chip-on voltage (on-state voltage) $V_{TM}^P$ closer to each other. One technique to accomplish the above, it may be contemplated to raise the power chip-on voltage $V_{TM}^P$. However, the rise of the power chip-on voltage $V_{TM}^P$ corresponds to increase of heat generation (loss) of a power element, and hence cannot be employed when a large current flows is used. As another technique, it may be contemplated to lower the power chip-on voltage $V_{TM}^P$. In order to realize this, for example in the case of the triac(triode bilateral thyristor) coupler system (the first conventional art example; see FIG. 8), it seems that from the viewpoint of a main switching element, a triac (thyristor) with a low operation current $I_G$ and a low voltage drop $V_{GT}$ of a resistor is to be selected. However, such a circuit configuration is always expensive. Moreover, since the current limiting resistor 817 is a protective resistor, the reduction of the resistance $R_{GS}$ is limited. The remaining way is to lower the on-state voltage $V_{TM1}$ of the photo-triac 815 in the triac (triode bilateral thyristor) coupler 813. However, the lowering of the on-state voltage $V_{TM1}$ is also limited because a photo-triac is inherently a semiconductor element.

On the other hand, Japanese Patent Publication (Kokai) No. HEI7-226130 "High current solid state AC relay with low EMI emission" proposes a solid state relay that comprises a pre-driver using a pair of MOSFETs in which the source terminals are connected to each other, whereby EMI noises can be reduced to a negligible level. However, also such a solid state relay cannot attain a small effect without a large increased device cost due to replacement and addition of circuit components.

Under such circumstances, a technique is proposed in which no countermeasure against noise is taken in a solid state relay, and a filter is added to the outside of the solid state relay, whereby the noise terminal voltage is lowered (EMI noises are solved). FIG. 12 shows a noise reduction circuit for a solid state relay having a typical EMI filter. As shown in that FIG. 12, the noise reduction circuit has a configuration in which is based on the circuit configuration shown in FIG. 11A, an EMI filter 1201 wherein capacitors 1202 and 1203 are respectively connected across the ends of a coil 1204 is connected between a load 1122 and a power source 1123. In FIG. 12, the same components as those of FIG. 10 are denoted by the same reference numerals, and their description is omitted.

When the EMI filter 1201 is disposed outside the solid state relay as above, a steep change of the power which causes noises can be filtered by the EMI filter 1201, and hence a improved noise reducing effect can be attained. However, in the case where the EMI filter is an LC filter as shown in FIG. 12, the resistance component of the coil 1204 generates a large amount of heat, and in the case where the filter is an RC filter, the incorporated resistor also generates a large amount of heat, with the result that the energy loss in the EMI filter is large. When using a solid state relay with a large current flow, a measure for increasing the wire diameter of the coil 1204 must be taken in order to lower the resistance. As a result, there arises a disadvantage in that the size of the EMI filter is extremely increased.

In a conventional solid state relay in which a thyristor or a triac (triode bilateral thyristor) is used as a main switching element, factors which determine the on-start voltage ($V_{ON1}$, $V_{ON2}$, $V_{ON3}$) at which the main switching element is turned on include elements such as a triac, a thyristor, and a photo-thyristor having anon-start voltage ($V_{TM1}$, $V_{TM2}$, $V_{TM3}$) that is relatively high. Therefore, the on-start voltage ($V_{ON1}$, $V_{ON2}$, $V_{ON3}$) of the main switching element is increased. This causes a problem in that the EMI noise level (noise terminal voltage) is inevitably made higher.

In a solid state relay using such a trigger system based on a triac, a thyristor, a photo-thyristor, or the like, it may be contemplated to take a countermeasure in order to lower the on-start voltage of a main switching element causing EMI noises in which a coupler of a low on-start voltage ($V_{TM}$), or an element of a low voltage drop ($V_{GT}$) is used. However, an element of a low on-start voltage ($V_{TM}$) or a low voltage drop ($V_{GT}$) is expensive, and the lowering of the voltage is limited because of the structure of the element. Therefore, EMI noises cannot be sufficiently reduced by such an internal improvement.

On the other hand, in the technique in which the EMI noise level (noise terminal voltage) is lowered by externally adding a filter, a steep change of the power can be filtered, and a large noise reducing effect can be attained. However, the technique has problems in that the filter size is large, the cost is high, the connection is inconvenience, and the heat generation is large.

The invention has been conducted in view of the problems of the conventional art. It is an object of the invention to provide a solid state relay in which less EMI noise (noise terminal voltage) is generated, and which can be produced without especially increasing the cost and the size as compared with a relay of the conventional art.

DISCLOSURE OF INVENTION

A first feature of the invention is a solid state relay that has a first external connection terminal which is conductive with one end of a main switching element, and a second external connection terminal which is conductive with another end of the main switching element, and is used with a load and a power source connected in series between the external connection terminals, wherein a third external connection terminal is disposed, the third external connection terminal is connected to the second external connection terminal via a capacitor, the load and the power source are connected in series between the first external connection terminal and the second external connection terminal, and a node of the load and the power source is connected to the third external connection terminal, thereby allowing a resistance of the load and an electrostatic capacitance of the capacitor to constitute an RC filter circuit for preventing noise leakage.

According to the first feature, the load and the power source are sequentially connected in series between the first external connection terminal and the second external connection terminal, and the node of the load and the power source is connected to the third external connection terminal. When the load is seen from the second external connection terminal and the third external connection terminal, therefore, an RC low-pass filter for preventing noise leaking is formed by the resistance component (R) of the load and the electrostatic capacitance (C) of the incorporated capacitor. As a result, even when a solid state relay of any type is used, the EMI noise level (noise terminal voltage) can be lowered.

Since the resistance component of the load is used in the filter, a radiator for the filter is not required. When the load is a heater or the like, particularly, the heat generated in the filter can be used directly as heating energy, and hence the relay is economical.

It is required only to dispose the new third external connection terminal, and internally connect the capacitor between the terminal and the second external connection terminal. Therefore, the cost and the size are not especially increased as compared with a relay of the conventional art.

A second feature is that the connection of the third external connection terminal and the second external connection terminal via the capacitor is made inside a body of the solid state relay.

According to the second feature, the connection of the third external connection terminal and the second external connection terminal via the capacitor is performed inside the body of the solid state relay. Unlike the case where the connection between the third external connection terminal and the second external connection terminal is performed outside of the body of the relay via a capacitor, therefore, an extra space for placing the capacitor is not necessary in the vicinity of a terminal block of the solid state relay, and the external appearance is not impaired by such a space.

A third feature is that the solid state relay has a capacitor mounting structure which allows the electrostatic capacitance of said capacitor to be variable.

According to the third feature, the solid state relay has a capacitor mounting structure which allows the electrostatic capacitance of the capacitor to be variable in accordance with the resistance of the external load. When the electrostatic capacitance of the capacitor is changed in accordance with the resistance of the external load so that the time constant RC is substantially constant, therefore, the frequency characteristic of the low-pass filter can always be set to an optimum value.

A fourth feature is that the capacitor mounting structure which allows the electrostatic capacitance of the capacitor to be variable is formed so that a whole or apart of the electrostatic capacitance of the internally connected capacitor is shared by one, two, or more capacitor units, and each of the capacitor units is detachable with respect to the body of the solid state relay via a connector.

According to the fourth feature, the capacitor mounting structure allows the electrostatic capacitance of the capacitor to be variable in accordance with the resistance of the external load. Furthermore, a configuration is employed in which the whole or apart of the electrostatic capacitance of the internally connected capacitor is shared by one, two, or more capacitor units, and each of the capacitor units is detachable with respect to the body of the solid state relay via a connector. Therefore, the electrostatic capacitance can be changed by performing only replacement or addition of the capacitor units, and without requiring wiring labor. Noise reduction suitable for the usage conditions can be easily realized.

A fifth feature is that the capacitor mounting structure which allows the electrostatic capacitance of the capacitor to be variable is formed so that a whole or apart of the electrostatic capacitance of the capacitor is made by a variable capacitance capacitor device.

According to the fifth feature, the capacitor mounting structure allows the electrostatic capacitance of the capacitor to be variable in accordance with the resistance of the external load. Furthermore, the whole or a part of the electrostatic capacitance of the internally connected capacitor is made by the variable capacitor device of a continuously variable type or a stepwise variable type. Therefore, the electrostatic capacitance can be changed by making only an adjustment or switching operation of the capacitor device, and without requiring wiring labor. Noise reduction suitable for the usage conditions can be more easily realized.

BRIEF DESCRIPTION OF DRAWINGS

FIG. 11B is a waveform chart showing the relationship between a load current I and a terminal-to-terminal voltage $V_T$ when a main output element is turned on, and FIG. 11C is a waveform chart enlargedly showing the terminal-to-terminal voltage $V_T$ at turning-on.

BEST MODE FOR CARRYING OUT THE INVENTION

Hereinafter, an embodiment of a solid state relay of the invention will be described in detail with reference to the accompanying drawings.

Figure 1A:
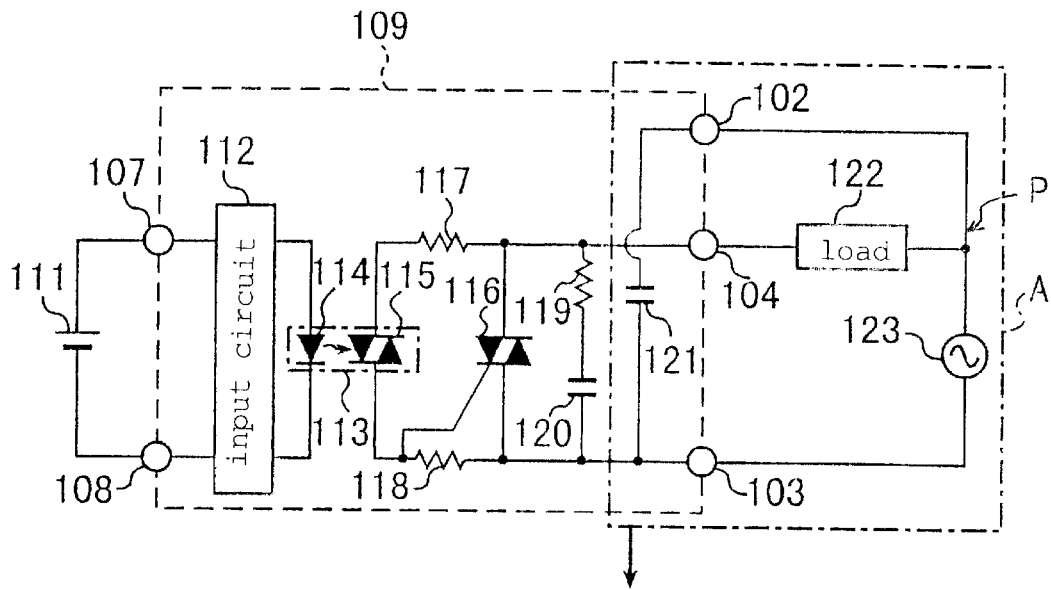
FIGS. 1A and 1B are circuit diagrams of a solid state relay which is an embodiment of the invention.

FIG. 1A is a circuit diagram showing the configuration of a solid state relay which is a first embodiment of the invention. As shown in the figure, many portions of the electrical configuration of the solid state relay 109 of the embodiment is similar to that of the solid state relay of the conventional art shown in FIG. 8. Namely, in the solid state relay 109, a triac (triode bilateral thyristor) 116 serving as a main switching element is triggered by a photo-triac(triode bilateral thyristor) coupler 113. In the figure, 107 and 108 denote a pair of input terminals to which an input signal voltage 111 is supplied, 112 denotes an input circuit which functions as a buffer or the like for an input signal, 113 denotes the photo-triac coupler (configured by optically coupling a light emitting diode 114 with a photo-triac(triode bilateral thyristor) 115) which electrically insulates the input circuit 112 and an output circuit from each other, 116 denotes a power triac incorporated into the output circuit and serves as a main switching element, 117 denotes a current limiting resistor for the photo-triac, 118 denotes a gate bias resistor for the power triac 116, a resistor element 119 and a capacitor element 120 are connected in series to constitute a surge absorbing circuit, 104 denotes a first external connection terminal which is conductive with one end of the triac 116 serving as the main switching element, and 103 denotes a second external connection terminal which is conductive with the other end of the triac 116 serving as the main switching element.

Figure 8:
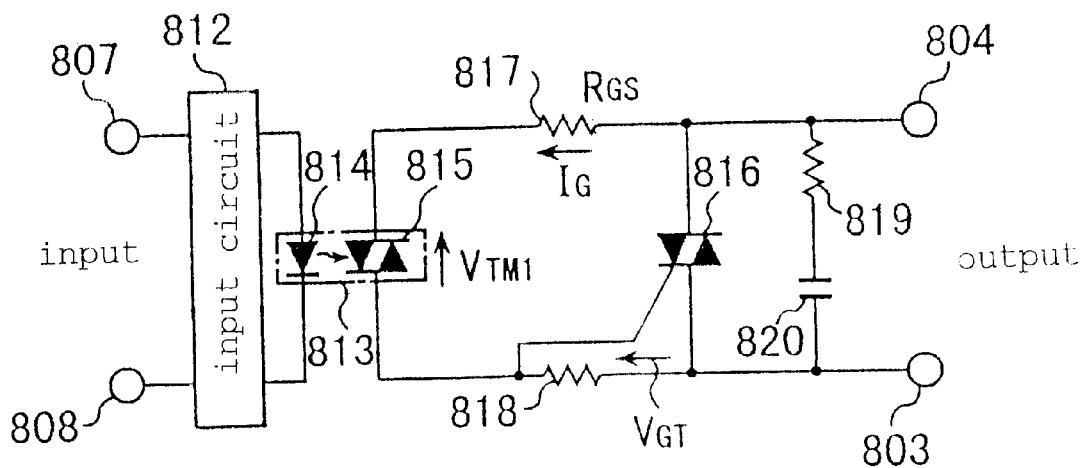
FIG. 8 is a circuit diagram of a solid state relay for AC controlling in a first conventional art example.
Figure 9:
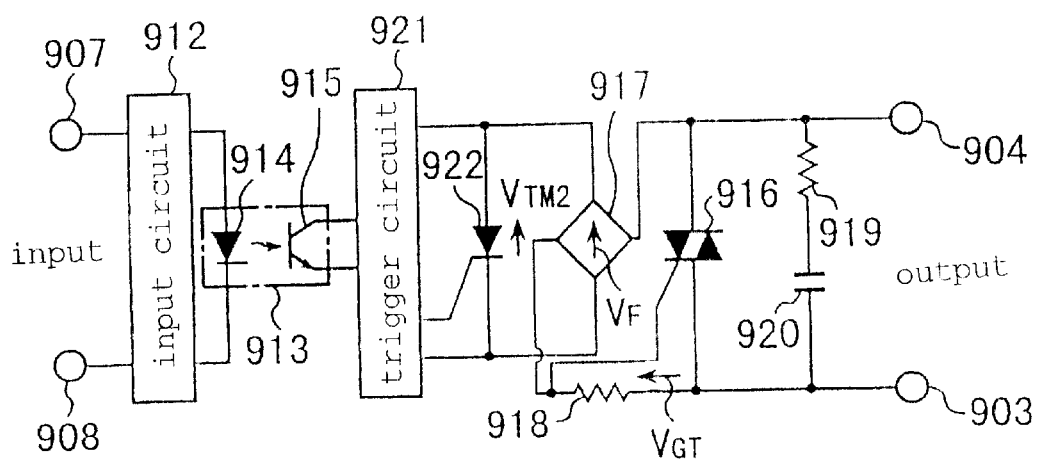
FIG. 9 is a circuit diagram of a solid state relay for AC controlling in a second conventional art example.
Figure 10:
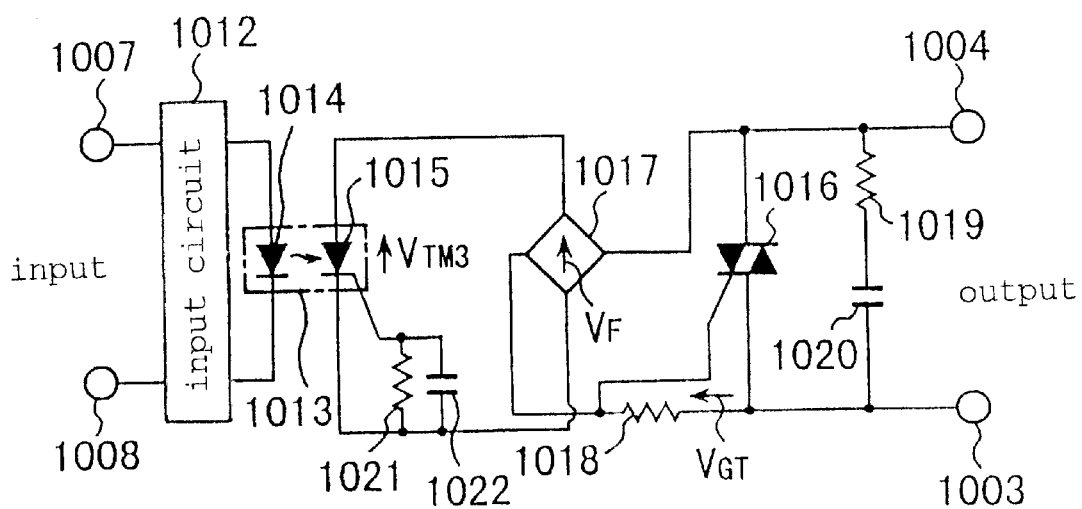
FIG. 10 is a circuit diagram of a solid state relay for AC controlling in a third conventional art example.

The solid state relay 109 of the embodiment is apparently different from the solid state relay of the conventional art shown in FIG. 8, in that the relay has a third external connection terminal 102, and also that the third external connection terminal 102 and the second external connection terminal 103 are connected to each other via a capacitor 121 inside the body of the solid state relay 109. In the embodiment, the connection of the third external connection terminal 102 and the second external connection terminal 103 via the capacitor 121 is performed inside the body of the solid state relay 109. Unlike the case where the connection between the third external connection terminal 102 and the second external connection terminal 103 is performed outside the body of the relay via a capacitor, extra space for placing the capacitor is not necessary in the vicinity of a terminal block of the solid state relay, and the external appearance is not impaired by such a space.

When the solid state relay 109 of the embodiment is to be used, a series circuit of a load 122 and a power source 123 is connected between the first external connection terminal 104 and the second external connection terminal 103 in the same manner as the conventional art example. On the other hand, the node P of the load 122 and the power source 123 is connected to the third external connection terminal 103 which is newly disposed.

Next, the fundamental operation of the solid state relay 109 of the embodiment will be described. When the input signal voltage 111 is off, a voltage is not supplied from the input circuit 112 to the light emitting diode 114, and hence the light emitting diode 114 does not emit light. Under this state, the photo-triac(triode bilateral thyristor) 115 is in the off-state, and also the triac(triode bilateral thyristor) 116 serving as the main switching element is in the off-state. Therefore, the current supply of the load 122 is not performed.

Figure 11A:
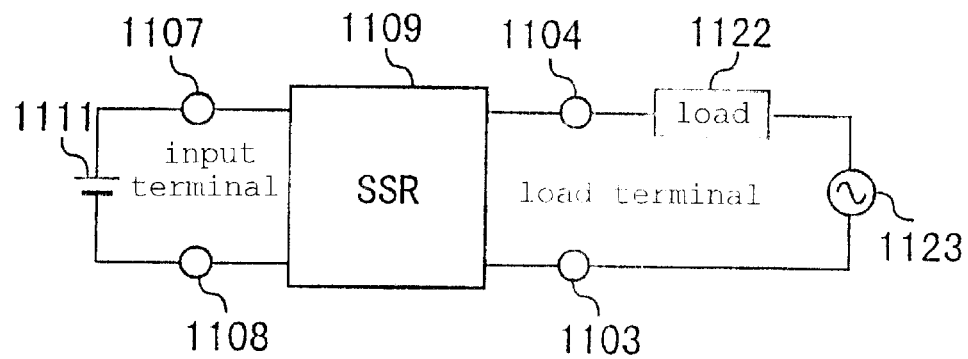
FIG. 11A is a diagram of a circuit to which a solid state relay is applied.
Figure 11B:
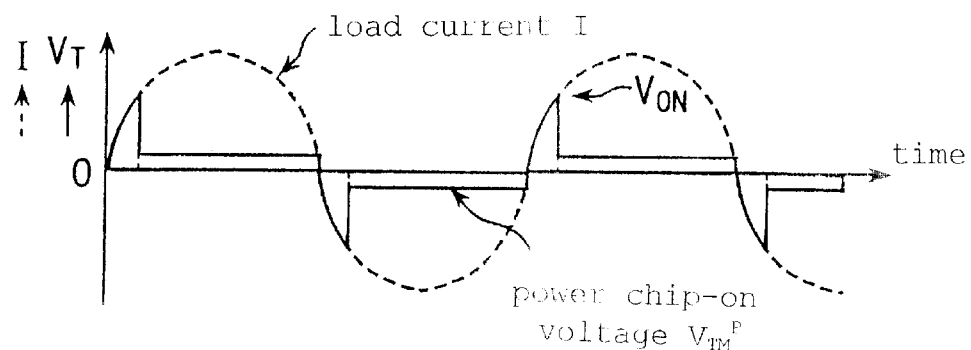

By contrast, when the input signal voltage 111 is on, a voltage is supplied from the input circuit 112 to the light emitting diode 114, and hence the light emitting diode 114 emits light. Under this state, the photo-triac(triode bilateral thyristor) 115 is in the on-state, and also the triac 116 serving as the main switching element is in the on-state. Therefore, the current supply of the load 122 is performed. As described above, under the state where the triac 116 is in the on-state, the load current I flows through the load 122, and the voltage $V_T$ between the terminals 103 and 104 is equal to the on-state voltage $V_{TM}$ of the triac 116 (see FIG. 11B).

Figure 11C:
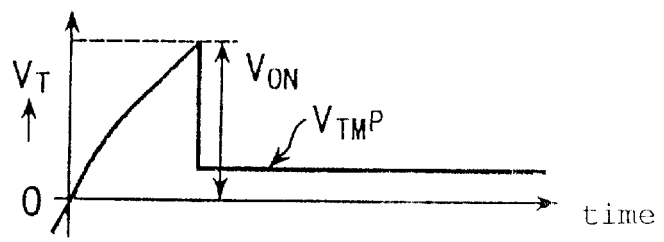
Figure 12:
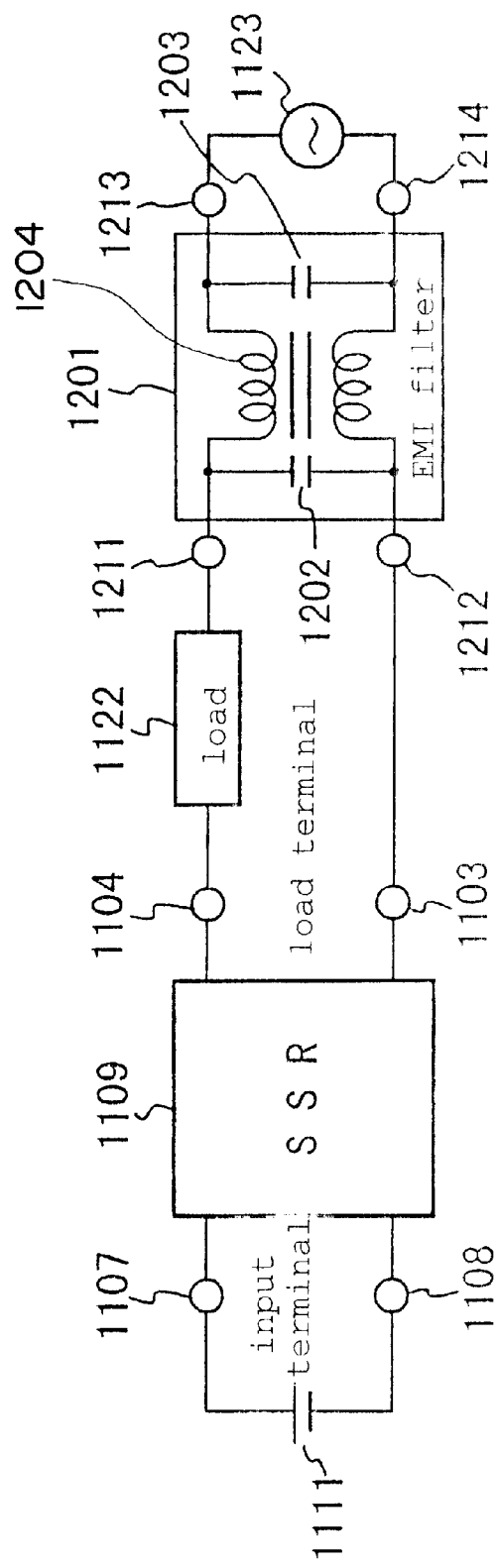
FIG. 12 is a circuit diagram of a noise reduction circuit for a solid state relay having an EMI filter.

Under this operation state of the solid state relay, as shown in FIG. 11C, the terminal-to-terminal voltage $V_T$ is steeply changed from $V_{ON}$ to $V_{TM}^P$ in a repeated manner, and hence large amounts EMI noise are generated and try to leak out to the power source line. In the solid state relay 109 of the embodiment, however, the node P of the load 122 and the power source 123 is connected to the third external connection terminal 102, and the capacitor 121 is interposed between the third external connection terminal and the second external connection terminal 103. Therefore, the noise is prevented from leaking out to the power source line, as described below.

Figure 1B:
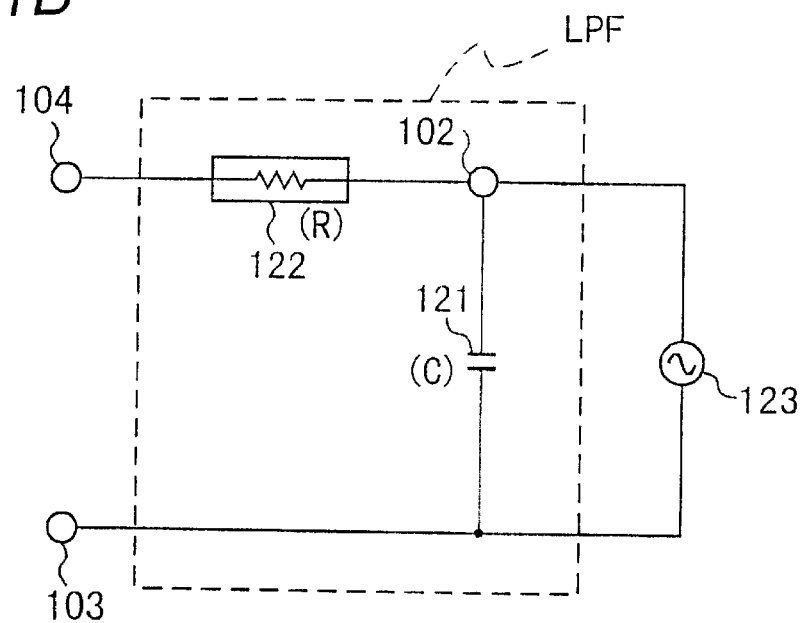

FIG. 1B shows an equivalent circuit seen as the load 122 from the first and second external connection terminals 104 and 103 of portion A enclosed by the long-short dash line in FIG. 1A, and FIG. 1B is a diagram which is obtained by extracting and redrawing connections related to the third external connection terminal 102 and the capacitor 121. As apparent from FIG. 1B, in a route from the solid state relay 109 to the power source 123, an RC low-pass filter consisting of the resistance component (R) of the load 122 and the electrostatic capacitance (C) of the capacitor 121 is interposed. Therefore, the steep change of the power is filtered by the function of the RC low-pass filter, thereby blocking the noise from leaking out to the power source line.

Hereinafter, effects of the solid state relay of the embodiment will be summarized.

As a first effect, the EMI noise level (noise terminal voltage) can be lowered.

As described above, when the load 122 is seen from the first external connection terminal 104 and the second external connection terminal 103, an RC low-pass filter is formed. Even when the solid state relay has any trigger type, the EMI noise level (noise terminal voltage) can be lowered. In the above description, namely, a trigger type in which the triac(triode bilateral thyristor) 116 serving as the main output element is triggered by the triac coupler 113 is employed in the solid state relay 109. However, the second conventional art example (of the system in which a main output element is triggered by a diode bridge and a thyristor), the third conventional art example (of the system in which a main output element is triggered by a diode bridge and a thyristor coupler), or a solid state relay of another anode firing system may be employed. The embodiment effectively functions irrespective of the kind of the solid state relay and the trigger system.

As a second effect, a low-noise system of the required minimum level which is suitable to the environment can be constructed by changing the capacitance (C) of the capacitor 121 in accordance with the environment.

In the above description, the load 122 having the resistance component (R), such as a heater has been described as an example. Even in the case where the load 122 has an inductance component or a capacitance component, when the capacitance (C) of the capacitor 121 is adequately selected, the filter effect of the RC low-pass filter is not lost. Namely, when the load 122 itself has an inductance component or a capacitance component, the same noise terminal level is attained by the capacitor 121 of a smaller capacitance (C). Therefore, an adequate setting corresponding to the load 122 is enabled.

As a third effect, the cost is much lower as compare with other noise reduction techniques, and the device size is not greatly increased as compared with devices of the conventional art.

As previously described, conventional noise reduction techniques are roughly classified into the following two techniques, i.e., the first technique in which a countermeasure is taken in the circuit configuration, for example, a coupler of a low on-start voltage ($V_{TM}$) is selected, and the second technique in which an EMI filter is externally added. When the noise reduction technique of the embodiment is compared with the second technique, the filter configuration using the resistance component of the load 122 such as a heater is employed in the embodiment. Therefore, it is apparent that great improvements in miniaturization of the device and reduction of the cost are achieved. When compared with the first technique, in the first technique, the on-start voltage ($V_{ON}$) at which the main switching element is triggered must be set to be equal to the power chip-on voltage ($V_{TM}^P$) in order to ensure noise terminal characteristics of the same level. As far as both the power system and the signal system similarly use PN junction semiconductor devices, it is very difficult to ensure the conditions. By contrast, in the embodiment, the noise reducing effect is attained at a level which is equal to that in the case where the photo-triac coupler 813 of the first conventional art example (see FIG. 8) is short-circuited (i.e., $V_{TM}^S=0$: similar to an ideal state in which no trigger element is used).

As a fourth effect, the energy can be efficiently used.

Conventionally, an EMI filter which is externally added is used via a coil or a resistor, and hence the heat generation produces a large problem. By contrast, in the embodiment, since the resistance component of the load 122 is directly used, a special radiator is not required. When the load 122 is a heater or the like, particularly, the heat generated in the filter can be used directly as heating energy, and hence the relay is economical.

Next, a capacitor mounting structure which allows the electrostatic capacitance (C) of the capacitor 121 to be variable in accordance with the use environment will be described in detail with reference to FIGS. 2 to 7.

Figure 2:
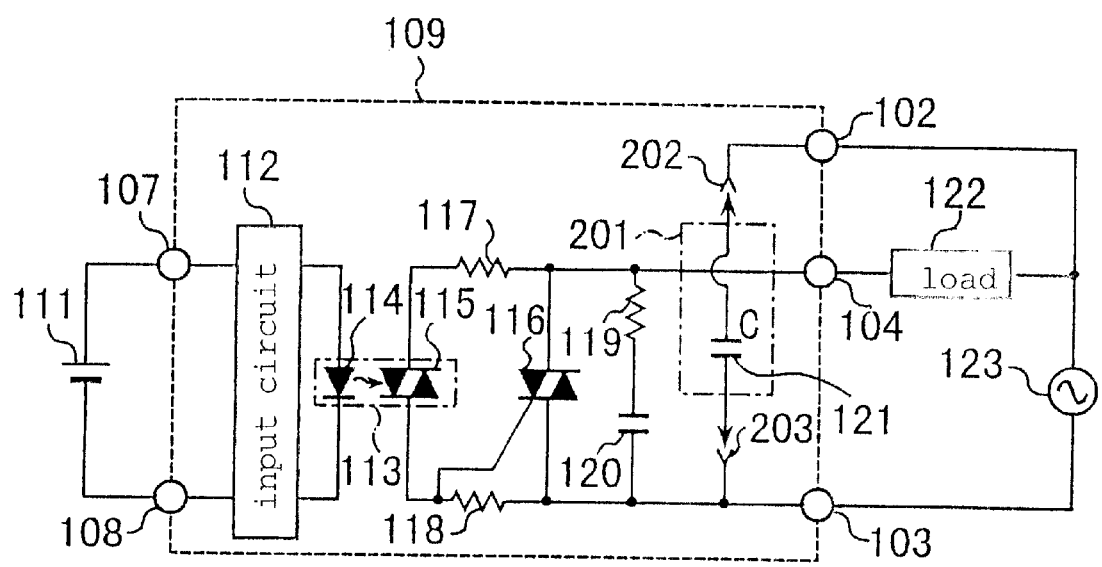
FIG. 2 is a circuit diagram showing a first capacitor mounting structure which allows the electrostatic capacitance of a capacitor to be variable.
Figure 3A:
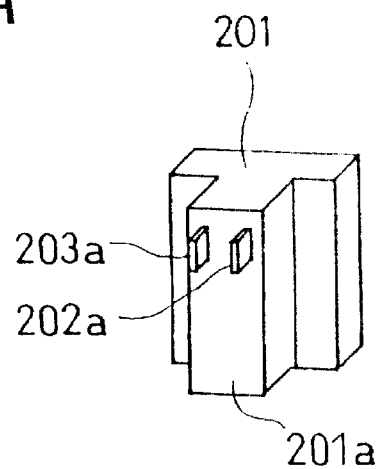
FIGS. 3A and 3B are external perspective views of the solid state relay and showing the first capacitor mounting structure which allows the electrostatic capacitance of a capacitor to be variable.
Figure 3B:
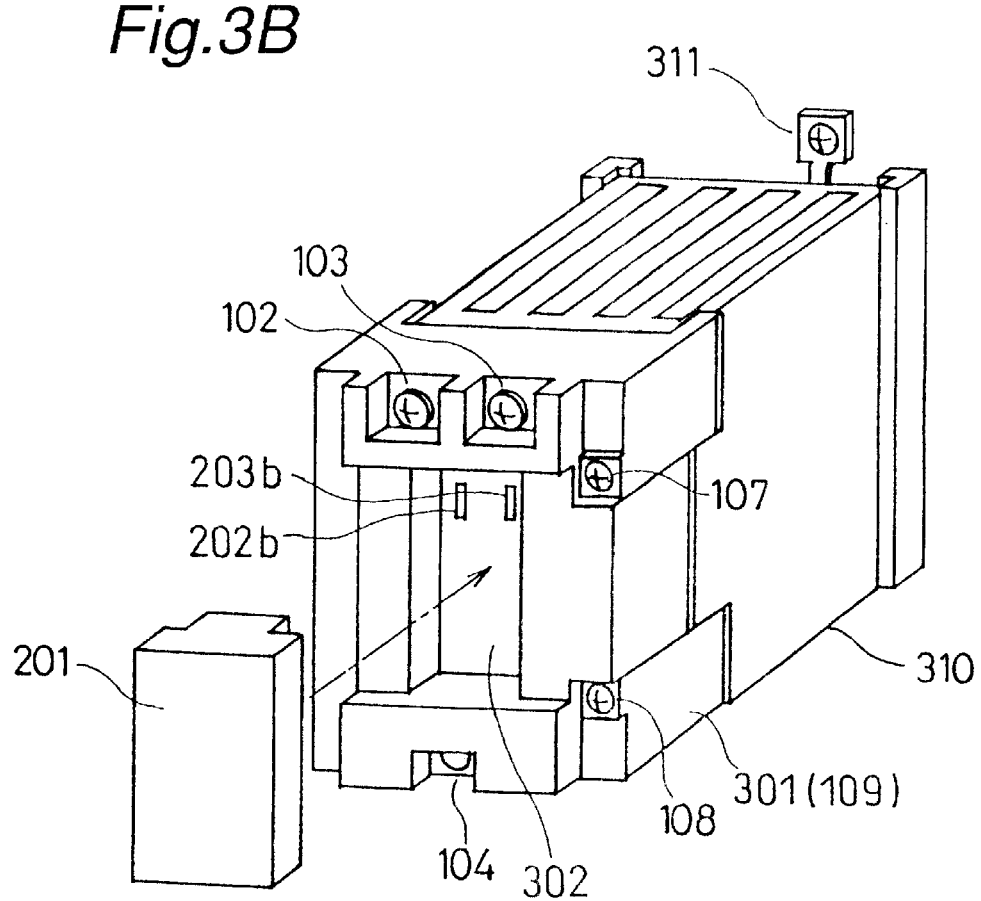

FIGS. 2 and 3 show a first capacitor mounting structure. As shown in FIG. 2, in the first capacitor mounting structure, the capacitor 121 is resin-molded into a predetermined shape to form a capacitor unit 201. The capacitor unit 201 is detachable via connectors 202 and 203 with respect to the body of the solid state relay. As shown in FIG. 3A, a projection 201a which, in this example, has a T-like section is formed in the capacitor unit 201. A pair of plug pieces 202a and 203a which constitute male halves of the connectors 202 and 203 protrude from the tip end face of the projection 201a. Plural kinds of the capacitor units 201 having, for example, the same shape are produced. The electrostatic capacitances vary from kind to kind. By contrast, as shown FIG. 3B, a recess 302 which receives the projection 201a of the capacitor unit 201 is formed on the body 301 of the solid state relay. A pair of sockets 202b and 203b which constitute female halves of the connectors 202 and 203 are formed in the innermost wall of the recess 302. In FIG. 3B, 102 denotes the third external connection terminal, 103 denotes the second external connection terminal, 104 denotes the first external connection terminal, 107 denotes the input terminal, 108 denotes the input terminal, 109 denotes the body of the solid state relay, 310 denotes a heat sink, and 311 denotes a mounting device. As apparent from FIG. 3B, the terminals 102, 103, 104, 107, and 108 have a screw terminal structure.

As described above, in the first capacitor mounting structure, the single capacitor unit 201 holds the whole of the electrostatic capacitance of the capacitor 121. The capacitor unit 201 is detachable via the connectors 202 and 203 with respect to the solid state relay body 301. Therefore, when a capacitor unit having an appropriate electrostatic capacitance is selected from the plural kinds of capacitor units and the selected capacitor unit is attached or replaced, the electrostatic capacitance of the capacitor 121 can be easily changed in accordance with the usage environment.

Figure 4:
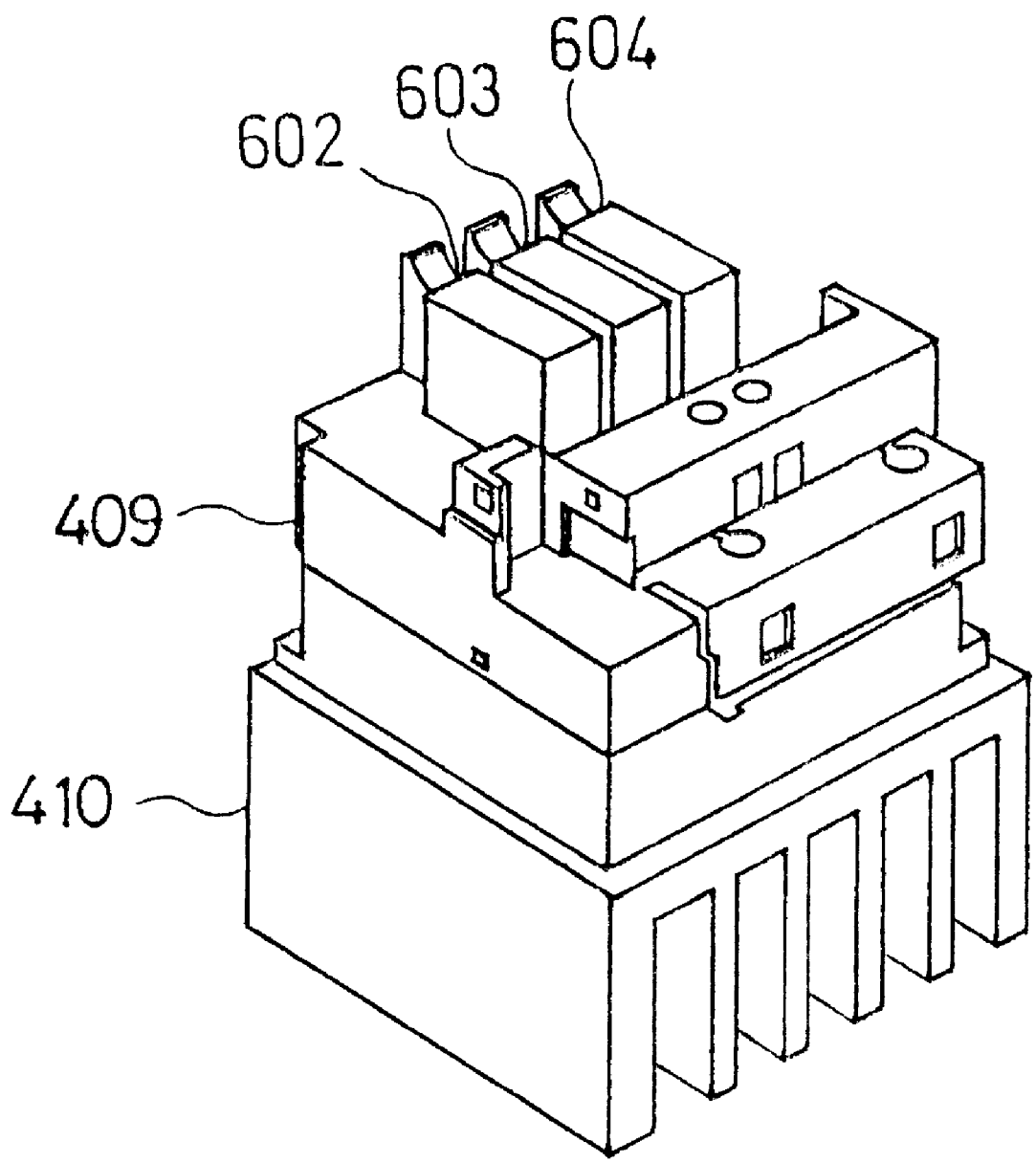
FIG. 4 is an external perspective view of the solid state relay and showing a second capacitor mounting structure which allows the electrostatic capacitance of a capacitor to be variable.
Figure 6:
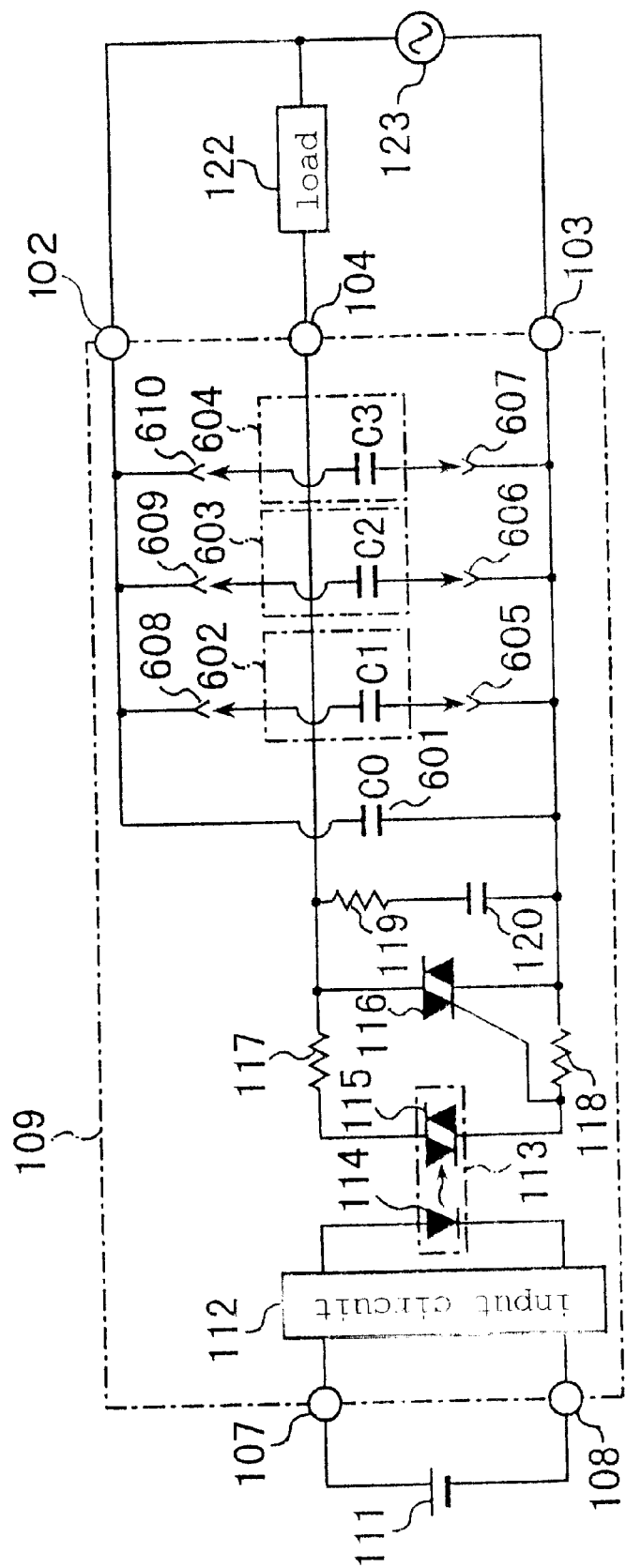
FIG. 6 is a circuit diagram showing the second capacitor mounting structure which allows the electrostatic capacitance of a capacitor to be variable.

FIGS. 4 and 6 show a second capacitor mounting structure. As shown in FIG. 4, in the second capacitor mounting structure, capacitors having predetermined electrostatic capacitances ($C_1$, $C_2$, $C_3$) are resin-molded into a predetermined shape to form one or two or more (in this example, three) capacitor units 602, 603, and 604. As shown in FIG.

6, the capacitor units 602, 603, and 604 are detachable via connectors 605 and 608, 606 and 609, and 607 and 610 with respect to the body 409 of the solid state relay. Although not shown in FIG. 4, an adequate plug-in structure may be employed as the connector structure. In FIG. 6, 601 denotes a capacitor (electrostatic capacitance $C_0$) which is fixedly built in. In FIG. 4, 410 denotes a heat sink. As shown in FIG. 6, the electrostatic capacitance $C_0$ of the capacitor 601 which is fixedly built in, and the electrostatic capacitances $C_1$, $C_2$, and $C_3$ of the capacitors incorporated into the capacitor units 602, 603, and 604 are connected in parallel. Therefore, the total combined electrostatic capacitance C is $C=C_0+C_1+C_2+C_3$.

As described above, in the second capacitor mounting structure, the one, two, or more (in this example, three) capacitor units 602, 603, and 604 hold a part ($C-C_0$) of the electrostatic capacitance of the capacitor (corresponding to the capacitor 121 of FIG. 1). The capacitor units 602, 603, and 604 are detachable via the connectors 605 and 608, 606 and 609, and 607 and 610 with respect to the solid state relay body 409. Therefore, when capacitor units having an appropriate electrostatic capacitance are combined from the plural kinds of capacitor units and the combination is attached or replaced, the electrostatic capacitance of the capacitor 121 can be easily changed in accordance with the usage environment. The electrostatic capacitances ($C_1$, $C_2$, $C_3$) of the capacitor units 602, 603, and 604 may have the same value or different values.

Figure 5A:
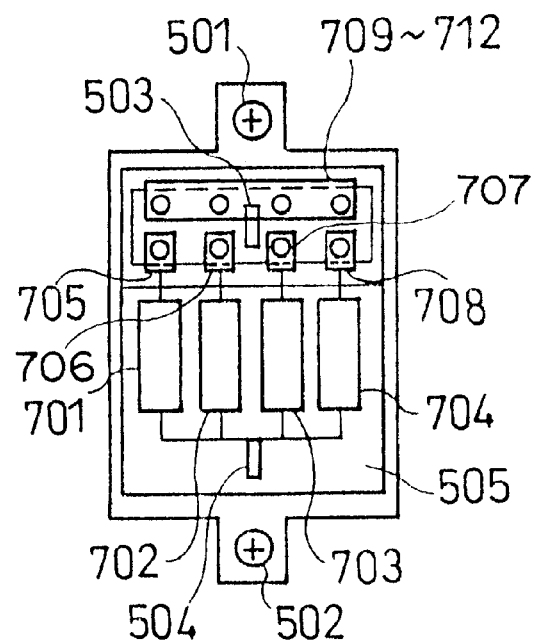
FIGS. 5A and 5B are a simplified plan view and a simplified section view of the solid state relay and showing a third capacitor mounting structure which allows the electrostatic capacitance of a capacitor to be variable.
Figure 5B:
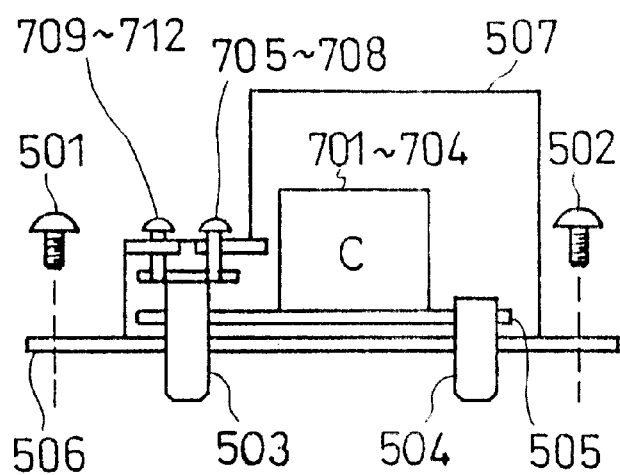
Figure 7:
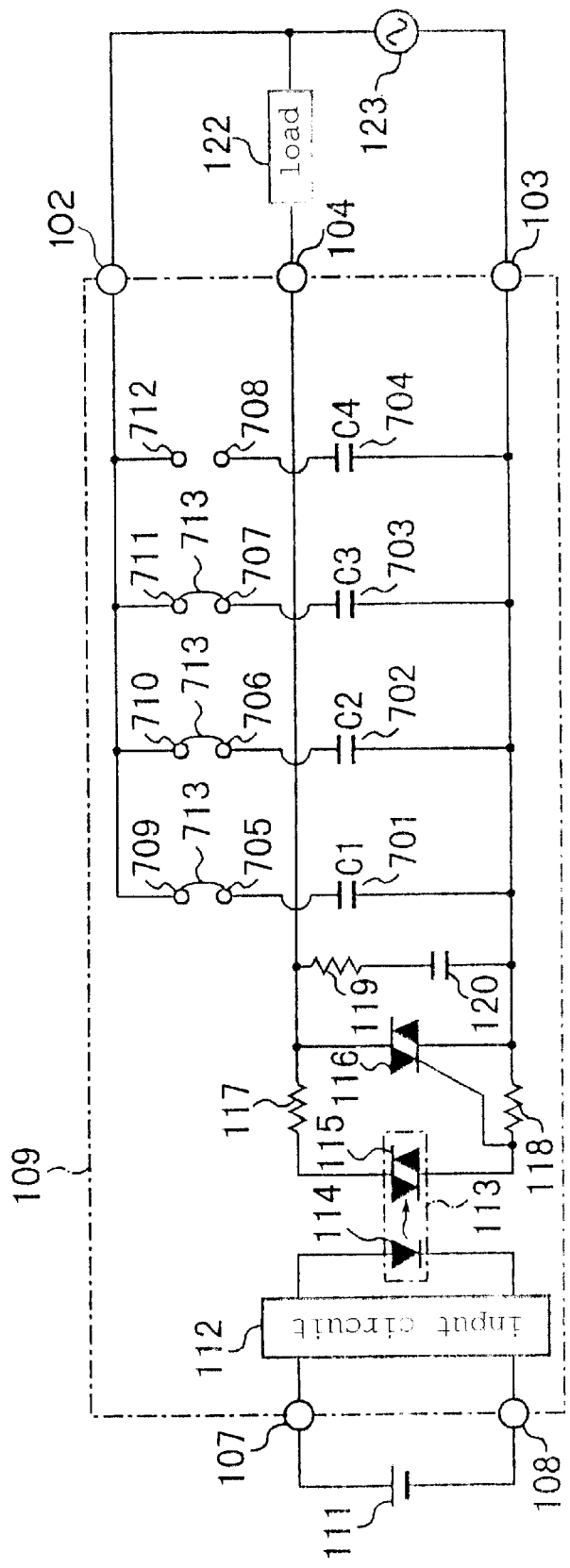
FIG. 7 is a circuit diagram showing the third capacitor mounting structure which allows the electrostatic capacitance of a capacitor to be variable.

FIGS. 5A, 5B, and 7 show a third capacitor mounting structure. As shown in the figures, in the third capacitor mounting structure, plural (in this example, four) capacitors 701, 702, 703, and 704 having predetermined electrostatic capacitances ($C_1$, $C_2$, $C_3$, $C_4$) are preinstalled into the body of the solid state relay. The one end of each capacitor is commonly connected to be conductive with the second external connection terminal 103. The other ends are respectively lead out to individual terminals 705, 706, 707, and 708, and, as required, then connected via a jumper member (a jumper pin, a jumper wire, a switch, or the like) to common terminals 709, 710, 711, and 712 which are conductive with the third external connection terminal 102.

FIGS. 5A and 5B are a schematic plan view (FIG. 5A) and a schematic section view (FIG. 5B) of a capacitor module which is used by being attached to, for example, the bottom of the solid state relay body. The capacitor module comprises a case body 507 and a case bottom plate 506. The case bottom plate 506 is attached to the case of the body of the solid state relay via screws 501 and 502. A circuit board 505 on which the four capacitors 701 to 704 are mounted is housed in the case. A pair of plug pieces 503 and 504 are fixed with protrusions to the case bottom plate 506. The basal portions of the plug pieces are conductive with predetermined positions of the circuit board 505. Namely, one ends of the capacitors 701 to 704 are commonly connected to be conductive with the plug piece 504. The other ends of the capacitors 701 to 704 are conductive with the individual terminals 705 to 708, respectively. Common terminals 709 to 712 are juxtaposed to the individual terminals 705 to 708, respectively. The common terminals are conductive with the basal portion of the above-mentioned plug piece 503. Therefore, when the individual terminals 705 to 708 and the common terminals 709 to 712 are connected by jumper members, a necessary number of capacitors are connected in parallel between the plug pieces 503 and 504. When the capacitor module is attached to the solid state relay body, the plug pieces 503 and 504 are connected to sockets which are on the side of the relay body and which are not shown. The sockets are conductive respectively with the third external connection terminal 102 and the second external connection terminal 103 which are shown in FIG. 7.

According to this configuration, the capacitor module constitutes a kind of a simplified variable capacitor device. Therefore, when the capacitor module is attached to the solid state relay body which is not shown and the connected capacitors are suitably selected by jumper members 713, the electrostatic capacitance of the capacitor can be easily changed in accordance with the usage environment. The electrostatic capacitances ($C_1$, $C_2$, $C_3$, $C_4$) of the capacitor units 701, 702, 703, and 704 may have the same value or different values. As shown in the example of FIG. 6, only a part of the total electrostatic capacitance may be variable. The structure of the variable capacitance capacitor device is not restricted to the above. It is a matter of course that, if the cost is allowed, a known variable capacitance capacitor of the slide type or the rotary type, or a semiconductor variable capacitor element such as a varicap diode may be incorporated.

The above-described techniques of changing the capacitance are suitable for the following usage. In the solid state relay incorporating a capacitor according to the invention, usually, the electrostatic capacitance of the incorporated capacitor will be determined while assuming the resistance load with respect to the maximum current which can flow through the main switching element. In the case where the current is not used at a full range, when the power source voltage V is fixed, therefore, the resistance component (R) of the load 122 is larger than the assumed value because of the relationship of $V=R \times I$. On the other hand, the cut-off frequency of an RC filter of a simple configuration is proportional to a product of R and C. Therefore, when C is constant, there is a fear that the cut-off frequency may be deviated from the optimum value. By contrast, when the electrostatic capacitance C of an incorporated capacitor is variable, it is possible to realize filter characteristics which are always optimum from the viewpoint of prevention of EMI noise leakage.

As apparent from the above description, according to the invention, it is possible to provide a solid state relay in which less EMI noise (noise terminal voltage) is generated, and which can be produced without especially increasing the cost and the size as compared with a relay of the conventional art.

INDUSTRIAL APPLICABILITY the above-mentioned solid state relay can be applied not only to the solid state relay of the described embodiments, but also to solid state relays of other embodiments.

What is claimed is:

1. A solid state relay that has a first external connection terminal which is conductive with one end of a main switching element, and a second external connection terminal which is conductive with another end of said main switching element, and is used with a load and a power source connected in series between said external connection terminals, wherein a third external connection terminal is disposed, said third external connection terminal is connected to said second external connection terminal via a capacitor, said load and said power source are connected in series between said first external connection terminal and said second external connection terminal, and a node of said load and said power source is connected to said third external connection terminal, thereby allowing a resistance of said load and an electrostatic capacitance of said capacitor to constitute an RC filter circuit for preventing noise leakage.

2. A solid state relay according to claim 1, wherein the connection of said third external connection terminal and said second external connection terminal via said capacitor is made inside a body of said solid state relay.

3. A solid state relay according to claim 1, wherein said solid state relay has a capacitor mounting structure which allows the electrostatic capacitance of said capacitor to be variable.

4. A solid state relay according to claim 3, wherein, in said capacitor mounting structure which allows the electrostatic capacitance of said capacitor to be variable, a whole or a part of the electrostatic capacitance of said capacitor is shared by one, two, or more capacitor units, and each of said capacitor units is detachable with respect to the body of said solid state relay via a connector.

5. A solid state relay according to claim 3, wherein, in said capacitor mounting structure which allows the electrostatic capacitance of the capacitor to be variable, a whole or a part of the electrostatic capacitance of said capacitor is made by a variable capacitance capacitor device.

* * * * *